United States Patent
Lim et al.

(10) Patent No.: US 11,366,171 B2
(45) Date of Patent: Jun. 21, 2022

(54) BATTERY STATE ESTIMATION METHOD

(71) Applicant: Samsung SDI Co., Ltd., Yongin-si (KR)

(72) Inventors: Byeonghui Lim, Yongin-si (KR); Christober Rayappan, Yongin-si (KR); Sungwook Paek, Yongin-si (KR); Minjeong Kang, Yongin-si (KR); Giheon Kim, Yongin-si (KR); Jake Kim, Yongin-si (KR); Yongjun Hwang, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 16/981,139

(22) PCT Filed: Mar. 8, 2019

(86) PCT No.: PCT/KR2019/002761
§ 371 (c)(1),
(2) Date: Sep. 15, 2020

(87) PCT Pub. No.: WO2019/208924
PCT Pub. Date: Oct. 31, 2019

(65) Prior Publication Data
US 2021/0048480 A1 Feb. 18, 2021

(30) Foreign Application Priority Data
Apr. 23, 2018 (KR) .......................... 10-2018-0046986

(51) Int. Cl.
*G01R 31/3842* (2019.01)
*G01R 31/367* (2019.01)
(Continued)

(52) U.S. Cl.
CPC ....... *G01R 31/3842* (2019.01); *G01R 31/367* (2019.01); *G01R 31/389* (2019.01); *G01R 31/3648* (2013.01); *G06F 17/16* (2013.01)

(58) Field of Classification Search
CPC .............. G01R 31/3842; G01R 31/389; G01R 31/367; G01R 31/3648; G06F 17/16
See application file for complete search history.

(56) References Cited

U.S. PATENT DOCUMENTS 7,612,532 B2   11/2009   Verbrugge
8,508,191 B2   8/2013    Kim et al.
(Continued)

FOREIGN PATENT DOCUMENTS

CN   107957562 A   *   4/2018
JP   2005-19019 A       1/2005
(Continued)

OTHER PUBLICATIONS

Tang et al., "Li-ion Battery Parameter Estimation for State of Charge" 2011 American Control Conference on O'Farrell Street, San Francisco, CA, USA, Jun. 29-Jul. 1, 2011 (Year: 2011).*
(Continued)

*Primary Examiner* — John C Kuan
(74) *Attorney, Agent, or Firm* — Lewis Roca Rothgerber Christie LLP

(57) ABSTRACT

A battery state estimation method includes: periodically measuring voltage and current of a battery in use to generate a voltage value and a current value; using an adaptive filter to generate a G parameter value for a G parameter and an H parameter value for an H parameter in real time from the voltage value and the current value, the G and H parameters indicating a present state of the battery; and using the G parameter value and the H parameter value to estimate the present state of the battery in real time. The G parameter is
(Continued)

a parameter that represents sensitivity of the voltage to changes in the current of the battery, and the H parameter is a parameter that represents an effective potential determined by local equilibrium potential distribution and resistance distribution inside the battery.

14 Claims, 5 Drawing Sheets

(51) Int. Cl.
    *G01R 31/389* (2019.01)
    *G01R 31/36* (2020.01)
    *G06F 17/16* (2006.01)

(56) References Cited

U.S. PATENT DOCUMENTS

| | | | |
|---|---|---|---|
| 9,658,291 | B1 | 5/2017 | Wang et al. |
| 9,784,794 | B2 | 10/2017 | Itabashi et al. |
| 10,267,864 | B2 | 4/2019 | Park et al. |
| 10,333,180 | B2 | 6/2019 | Seo et al. |
| 10,338,146 | B2 | 7/2019 | Hametner et al. |
| 10,491,022 | B2 | 11/2019 | MirTabatabaei et al. |
| 2007/0096743 | A1 | 5/2007 | Arai et al. |
| 2009/0027007 | A1 | 1/2009 | Iwane et al. |
| 2009/0266631 | A1 | 10/2009 | Kikuchi |
| 2011/0025258 | A1 | 2/2011 | Kim et al. |
| 2014/0074416 | A1 | 3/2014 | Park et al. |
| 2015/0362559 | A1 | 12/2015 | Hametner et al. |
| 2017/0222448 | A1 | 8/2017 | MirTabatabaei et al. |
| 2018/0045787 | A1 | 2/2018 | Hellgren et al. |
| 2018/0069272 | A1 | 3/2018 | Seo et al. |
| 2018/0111599 | A1* | 4/2018 | Wang .................. B60W 10/06 |
| 2018/0196106 | A1* | 7/2018 | Sankavaram ........ G07C 5/0808 |

FOREIGN PATENT DOCUMENTS

| | | |
|---|---|---|
| JP | 2007-5304 A | 1/2007 |
| JP | 2007-187534 A | 7/2007 |
| JP | 2007-306771 A | 11/2007 |
| JP | 2011-122951 A | 6/2011 |
| JP | 2012-57964 A | 3/2012 |
| JP | 2012-63251 A | 3/2012 |
| JP | 2013-501488 A | 1/2013 |
| JP | 2014-522488 A | 9/2014 |
| JP | 2014-202630 A | 10/2014 |
| JP | 5635608 B2 | 12/2014 |
| JP | 2016-513238 A | 5/2016 |
| JP | 2017-75784 A | 4/2017 |
| JP | 2017-198542 A | 11/2017 |
| JP | 2018-510337 A | 4/2018 |
| JP | 2018-523891 A | 8/2018 |
| KR | 10-2013-0049920 A | 5/2013 |
| KR | 10-1282687 B1 | 7/2013 |
| KR | 10-1398465 B1 | 5/2014 |
| KR | 10-1486470 B1 | 1/2015 |
| KR | 10-2015-0111961 A | 10/2015 |
| KR | 10-2017-0022758 A | 3/2017 |
| WO | WO 2017/129527 A1 | 8/2017 |

OTHER PUBLICATIONS

Gao et al., "Brief overview of electrochemical potential in lithium ion batteries" Chin. Phys. B vol. 25, No. 1 (2016) 018210 (Year: 2016).*

Kim, Gi-Heon et al.; "Multi-Domain Modeling of Lithium-Ion Batteries Encompassing Multi-Physics in Varied Length Scales"; J. Electrochem. Soc.; 158; (8); pp. A955-A969 (2011).

Kim, Gi-Heon et al.; "Efficient and Extensible Quasi-Explicit Modular Nonlinear Multiscale Battery Model: GH-MSMD"; Journal of the Electrochemical Society; 164 (6); pp. A1076-A1088 (2017).

Herdjunanto, Samiadji, "Estimation of Open Circuit Voltage and Electrical Parameters of a Battery Based On Signal Processed by Recursive Least Square Method Using Two Separate Forgetting Factors," 6th International Annual Engineering Seminar (InAES), 2016, 5 pages.

EPO Extended European Search Report dated Dec. 1, 2021, issued in corresponding European Patent Application No. 19794066.1 (8 pages).

Japanese Office Action dated Dec. 13, 2021, issued in corresponding Japanese Patent Application No. 2020-556875 (7 pages).

* cited by examiner

BATTERY STATE ESTIMATION METHOD

CROSS-REFERENCE TO RELATED APPLICATION(S)

This application is a National Phase Patent Application of International Patent Application Number PCT/KR2019/002761, filed on Mar. 8, 2019, which claims priority of Korean Patent Application No. 10-2018-0046986, filed Apr. 23, 2018. The entire contents of both of which are incorporated herein by reference.

TECHNICAL FIELD

The present disclosure relates to a method of estimating the state of a battery in real time.

BACKGROUND ART

Batteries have high applicability compared to other energy storage devices and have been widely used in electric vehicles (EVs) or hybrid electric vehicles (HEVs) driven by electric driving sources as well as portable devices due to characteristics such as relatively high energy and power density. In particular, when a strong output is required, a battery pack, in which a plurality of batteries are connected in series and in parallel, may also be used.

Battery management is significant for energy-efficient and safe use of batteries or battery-powered electrical devices, and to this end, accurate estimation and diagnosis of the internal state of a battery is essential. Battery internal states used to represent the characteristics of a present battery include a resistance component, a capacitance component, and an open circuit voltage (OCV).

DESCRIPTION OF EMBODIMENTS

Technical Problem

Provided is a battery state estimation method, whereby the state of a battery may be estimated by using a voltage value and a current value obtained by measuring voltage and current of the battery.

Solution to Problem

According to an aspect of the present disclosure, a battery state estimation method includes periodically measuring the voltage and current of a battery in use to generate a voltage value and a current value, using an adaptive filter to generate a G parameter value and an H parameter value in real time from the voltage value and the current value, said parameters indicating the present state of the battery, and using the G parameter value and the H parameter value to estimate the state of the battery in real time. The G parameter may be a parameter that represents the sensitivity of the voltage to changes in the current of the battery, and the H parameter may be a parameter that represents an effective potential determined by the local equilibrium potential distribution and resistance distribution inside the battery.

The adaptive filter may be a filter using a recursive least squares (RLS) method.

The battery state estimation method may further include initializing a state vector composed of the G parameter and the H parameter, and a covariance matrix. The generating of the G parameter value and the H parameter value in real time may include calculating a present voltage estimate of the battery based on the present current value and an immediately preceding value of the state vector and updating a gain matrix and the covariance matrix on a basis of the present current value and the immediately preceding value of the covariance matrix, calculating a voltage error between the present voltage value and the present voltage estimate, and updating the state vector based on the immediately preceding value of the state vector, a present value of the gain matrix, and the voltage error so as to generate a present value of the G parameter and a present value of the H parameter.

The present voltage estimate of the battery may be calculated as a value obtained by adding an immediately preceding value of the H parameter to a product of the present current value and the immediately preceding value of the G parameter.

The present value of the state vector may be calculated as a value obtained by adding an immediately preceding value of the H parameter to a product of the present current value and an immediately preceding value of the G parameter.

When the gain matrix and the covariance matrix are updated, a first forgetting factor relating to the G parameter and a second forgetting factor relating to the H parameter may be applied.

The gain matrix may be calculated by the following equation.

$$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda_1 \\ P_2(t-1)/\lambda_2 \end{bmatrix}$$

The covariance matrix may be calculated by the following equation.

$$P(t) = \begin{bmatrix} P_1(t) \\ P_2(t) \end{bmatrix} = \begin{bmatrix} \{1 - L_1(t)I(t)\}P_1(t-1)/\lambda_1 \\ \{1 - L_2(t)\}P_2(t-1)/\lambda_2 \end{bmatrix}$$

Here, $L(t)$ is a present value of the gain matrix, $L(t-1)$ is an immediately preceding value of the gain matrix, $P(t)$ is a present value of the covariance matrix, $P(t-1)$ is an immediately preceding value of the covariance matrix, $I(t)$ is the present current value, $\lambda_1$ may be the first forgetting factor, and $\lambda_2$ may be the second forgetting factor.

Each of the G parameter, the H parameter, and the covariance matrix may include first through third G parameters, first through third H parameters, and first through third covariance matrices. The battery state estimation method may further include initializing a first state vector composed of the first G parameter and the first H parameter, a second state vector composed of the second G parameter and the second H parameter, a third state vector composed of the third G parameter and the third H parameter, and the first through third covariance matrices.

The battery state estimation method may further include, when a current difference between the present current value and the immediately preceding current value is greater than or equal to a first threshold value, calculating a present voltage estimate of the battery based on the present current value and a recent value of the first state vector, updating the gain matrix and the first covariance matrix based on the present current value and an immediately preceding value of the first covariance matrix, and updating the first state vector based on the recent value of the first state vector, a present value of the gain matrix, and the voltage error so as to generate a present value of the first G parameter and a present value of the first H parameter.

The battery state estimation method may further include, when the battery is modeled as an equivalent circuit in which a voltage Vocv, a series resistor R0 and two parallel resistor-capacitor (RC) networks are connected in series, estimating a value of the series resistor R0 of the battery based on the present value of the first G parameter. The battery state estimation method may further include, when a current difference between the present current value and the immediately preceding current value is less than or equal to a second threshold value, calculating a present voltage estimate of the battery based on the present current value and a recent value of the first state vector and updating the gain matrix and the first covariance matrix based on the present current value and an immediately preceding value of the first covariance matrix, and updating the second vector based on the recent value of the second state vector, the present value of the gain matrix, and the voltage error so as to generate a present value of the second G parameter and a present value of the second H parameter.

The battery state estimation method may further include, when the battery is modeled as an equivalent circuit in which a voltage Vocv, a series resistor R0 and two parallel resistor-capacitor (RC) networks are connected in series, estimating the sum of resistance components of the equivalent circuit of the battery based on the present value of the second G parameter.

The battery state estimation method may further include estimating the voltage source Vocv of the battery based on the present value of the second H parameter.

The battery state estimation method may further include, when a current difference between the present current value and the immediately preceding current value is less than a first threshold value and exceeds a second threshold value less than the first threshold value, calculating a present voltage estimate of the battery based on the present current value and the recent value of the third state vector and updating the gain matrix and the third covariance matrix based on the present current value and an immediately preceding value of the third covariance matrix, and updating the third state vector based on the recent value of the third state vector, the present value of the gain matrix, and the voltage error so as to generate a present value of the third G parameter and a present value of the third H parameter.

According to another aspect of the present disclosure, a battery state estimation method includes initializing first through third state vectors and first through third covariance matrices used in a recursive least squares (RLS) filter, wherein each of the first through third state vectors includes first through third G parameters and first through third H parameters, measuring voltage and current of the battery in use every first time period to generate an immediately preceding voltage value and an immediately preceding current value and generate a present voltage value and a present current value after the first time period elapses, in a case where a current difference between the present current value and the immediately preceding current value is greater than or equal to a first threshold value, updating the first state vector and the first covariance matrix, and in a case where the current difference is less than or equal to a second threshold value less than the first threshold value, and in a case where the current difference exceeds the second threshold value and is less than the first threshold value, updating the third state vector and the third covariance matrix, and in a case where the battery is modeled as an equivalent circuit in which a voltage source Vocv, a series resistor R0 and two parallel resistor-capacitor (RC) networks are connected in series, estimating a value of the series resistor R0 of the battery in real time as a value of the first G parameter of the first state vector and estimating a sum of resistance components of the equivalent circuit of the battery in real time as a value of the second G parameter of the second state vector.

The updating of the first state vector and the first covariance matrix may include calculating a present voltage estimate of the battery based on the present current value and a recent value of the first stator and updating a gain matrix and the first covariance matrix, calculating a voltage error between the present voltage value and the present voltage estimate, and updating the first state vector based on a recent value of the first state vector, a present value of the gain matrix, and the voltage error.

When the gain matrix and the first covariance matrix are updated, a first forgetting factor relating to the first G parameter and a second forgetting factor relating to the first H parameter may be applied.

The updating of the second state vector and the second covariance matrix may include calculating a present voltage estimate of the battery based on the present current value and a recent value of the second state vector and updating the gain matrix and the second covariance matrix, calculating a voltage error between the present voltage value and the present voltage estimate, and updating the second state vector based on the recent value of the second state vector, the present value of the gain matrix, and the voltage error.

Advantageous Effects of Disclosure

A battery internal state estimation method according to various embodiments of the present disclosure is advantageous in terms of cost, scalability, and adaptability, compared to a conventional method. In particular, because the internal state of a battery is directly estimated from values that can be directly measured rather than an estimation method based on limited experimental data like a conventional experimental model, higher accuracy may be achieved.

In addition, the battery internal state estimation method according to various embodiments of the present disclosure can be implemented with a battery management system (BMS). Even in the past, the BMS can be used to estimate the battery internal state. However, the internal state of the battery can be estimated based on a table created on the basis of experimental data. Thus, not only an estimation error is large, but also all data of the table are required to be stored. However, according to the present disclosure, because a calculation time can be drastically reduced and there is no need to store table type data, the method according to the present disclosure can be easily implemented even with the BMS.

Thus, the state of the battery can be accurately estimated in real time through simple calculations by using a voltage value and a current value obtained by measuring voltage and current of the battery according to various embodiments of the present disclosure. Since only the measured data of voltage and current of the battery is used, there is not much hardware required, and a calculation process for estimating the state of the battery is not complicated. Thus, the state of the battery can be accurately estimated in real time even on a microprocessor with low specifications, such as the BMS of a battery pack. In addition, since the amount of data required for calculations for estimating the battery state is not much, the method according to the present disclosure can be performed even when the size of memory is not large.

BEST MODE

Figure 1:
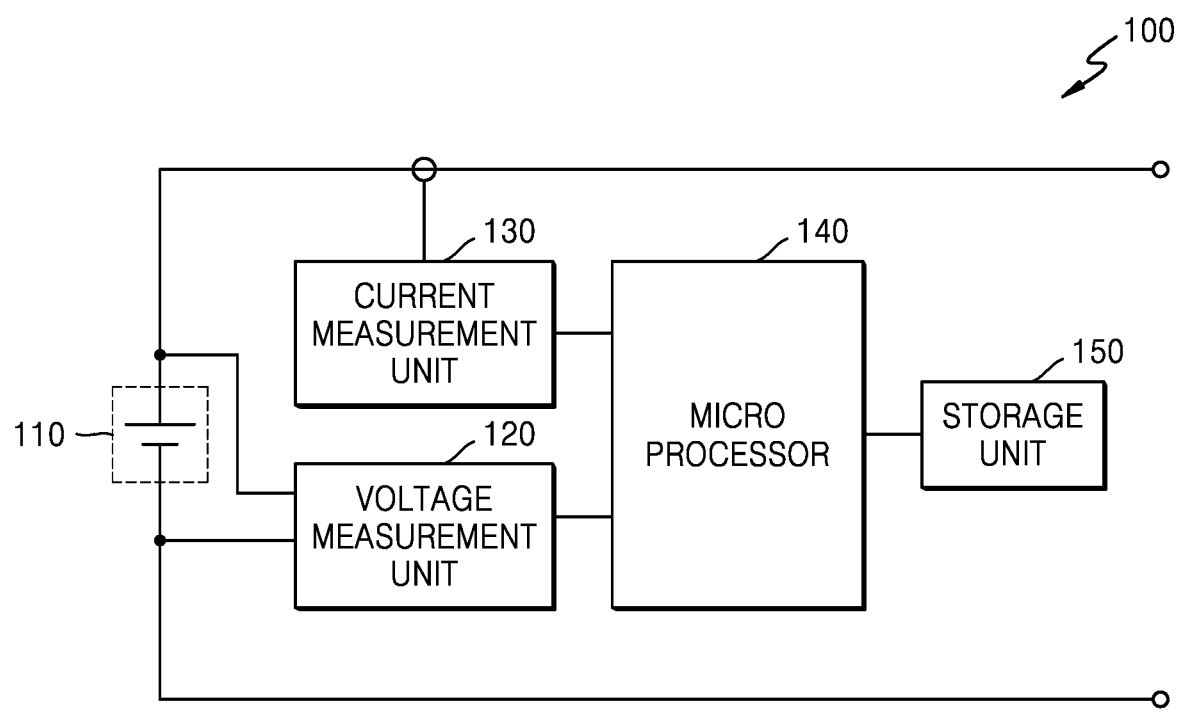
FIG. 1 is a schematic configuration view of a battery system for performing a battery state estimation method according to an embodiment.

Advantages and features of the present disclosure, and ways to achieve them will become apparent by referring to embodiments that will be described later in detail with reference to the drawings. However, the present disclosure is not limited to embodiments presented below but may be embodied in various different forms, and it is to be appreciated that all changes, equivalents, and substitutes that do not depart from the spirit and technical scope of the invention are encompassed in the present disclosure. The embodiments presented below are provided to make the disclosure of the present disclosure complete, and to fully inform the scope of the present disclosure to those skilled in the art to which the present disclosure pertains. In the description of the present disclosure, certain detailed explanations of related art are omitted when it is deemed that they may unnecessarily obscure the essence of the present disclosure.

The terms used in this application are only used to describe specific embodiments, and are not intended to limit the present disclosure. As used herein, the singular forms "a," "an," and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components. It will be understood that although the terms "first," "second," etc. may be used herein to describe various components, these components should not be limited by these terms. These terms are used only to distinguish one component from other components.

Hereinafter, embodiments of the present disclosure will be described below in more detail with to the accompanying drawings. Those components that are the same or are in correspondence are rendered the same reference numeral regardless of the figure number, and a redundant description therewith is omitted.

FIG. 1 is a schematic configuration view of a battery system for performing a battery state estimation method according to an embodiment.

Referring to FIG. 1, a battery system 100 may include a battery 110, a voltage measurement unit 120, a current measurement unit 130, a microprocessor 140, and a storage unit 150.

The battery 110 that is a unit for storing power may include at least one battery cell. The battery 110 may include a plurality of battery cells, and the plurality of battery cells may be connected in series, in parallel, or in a combination of series and parallel. Each of the battery cells may include a rechargeable secondary cell. For example, each of the battery cells may include a nickel-cadmium battery, a nickel metal hydride (NiMH) battery, a lithium ion battery, or a lithium polymer battery. The number of battery cells included in the battery 110 may be determined according to a required output voltage.

Although one battery 110 is shown in FIG. 1, a plurality of batteries 110 may be connected in parallel and/or in series and may be connected to a load and/or a charging device through external terminals. Although not shown in FIG. 1, the battery 110 is being used in connection with a load and/or a charging device and may be discharged to supply power to the load or charging by receiving power from the charging device.

The voltage measurement unit 120 may be connected to both terminals of the battery 110 being used and may periodically measure the voltage of the battery 110 so as to generate a voltage value. For example, the voltage measurement unit 120 may measure a voltage of both terminals of the battery 110 in a first time period Δt, may refer to a currently or recently measured voltage value as a present voltage value and may indicate the present voltage value by V(t). In addition, a voltage value measured before the first time period Δt may be referred to as an immediately preceding voltage value and indicated by V(t−1). The first time period Δt may be, for example, 1 second. However, this is just an example, and the first time period Δt may be set to another time. For example, the first time period Δt may be set to 0.1 seconds, 0.5 seconds, 2 seconds, 5 seconds, or 10 seconds. The first time period Δt may be properly set according to an electrical system in which the battery 110 is used.

Although FIG. 1 shows that the voltage measurement unit 120 measures the voltage of both terminals of the battery 110, when the battery 110 includes a plurality of battery cells, a plurality of battery modules or a plurality of battery packs, the voltage measurement unit 120 may also measure a voltage of both terminals of each battery cell, each battery module, or each battery pack.

The current measurement unit 130 may periodically measure the current of the battery 110 being used, so as to generate a current value. The voltage measurement unit 120 and the current measurement unit 130 may be synchronized with each other so as to measure voltage and current of the battery 110 at the same time. The current measurement unit 130 may also measure the current of the battery 110 in the first time period Δt. The current value measured by the current measurement unit 130 may be displayed positive (+) when it is a charging current and negative (−) when it is a discharging current. The currently or recently measured current value may be referred to as a present current value and indicated by I(t), and the current value measured before the first time period may be referred to as an immediately preceding current value and indicated by I(t−1).

The microprocessor 140 may generate a value of a G parameter and a value of an H parameter that indicate the present state of the battery from the voltage value provided by the voltage measurement unit 120 and the current value provided by the current measurement unit 130. Here, the G parameter may be a parameter indicating the sensitivity of a voltage with respect to a current change of the battery 110 being used, and the H parameter may be a parameter indicating an effective potential determined by local equilibrium potential distribution and resistance distribution.

The microprocessor 140 may use an adaptive filter so as to generate the value of the G parameter and the value of the H parameter from the voltage value and the current value. The adaptive filter used by the microprocessor 140 may be a filter using a recursive least squares (RLS) method or a filter using a weighted least squares (WLS) method. Hereinafter, an embodiment in which the microprocessor 140 uses a filter using an RLS method, will be described in detail.

The microprocessor 140 may estimate the state of the battery 110 in real time by using the value of the G parameter and the value of the H parameter generated in real time. Here, the state of the battery 110 that may be estimated according to the present embodiment may be an open circuit voltage (OCV), a series resistance component, and a total resistance component in the battery 110.

Because the microprocessor 140 may perform a battery state estimation method according to the present embodiment through four simple arithmetic operations, the microprocessor 140 may be included in the BMS of the battery pack. According to another embodiment, the microprocessor 140 may be included in the BMS or an electronic control unit (ECU) of an electric vehicle. According to another embodiment, the microprocessor 140 may be included in a controller of an energy storage system. According to another embodiment, the microprocessor 140 may be implemented as a processor of a server that is communicatively connected and communicates with the battery system or energy storage system.

The storage unit 150 may store commands and data required to perform the battery state estimation method according to the present embodiment by the microprocessor 140. In the battery state estimation method according to the present embodiment, the value of the G parameter and the value of the H parameter are generated based on the voltage value and the current value generated every first time period Δt and the state of the battery 110 are estimated by using the value of the G parameter and the value of the H parameter, and thus the storage unit 150 does not need to store other voltage and current data than the current voltage value, the present current value, and the immediately preceding current value. That is, the storage unit 150 does not need to store a large amount of voltage and current data. In addition, in the battery state estimation method according to the present embodiment, the storage unit 150 may store an immediately preceding value and a present value of a state vector composed of a G parameter and an H parameter and an immediately preceding value and a present value of a covariance matrix required for the calculation of a recursive least squares (RLS) method. Thus, the storage unit 150 does not need to store a large amount of commands and data and thus may be implemented as memory having a small size. For example, the storage unit 150 may also be implemented as memory inside the microprocessor 140.

In the related art, the correlation between measurable parameters, such as current, voltage, and temperature, of the battery and the internal state to be estimated is experimentally found in advance and then, the correlation is made in a table form, and the resistance and capacitance of the battery, and the internal state such as an open circuit voltage, is estimated. These battery state estimation methods need to find the correlation between the measurable parameters and the internal state through experiments and thus require much costs and time and have disadvantages in terms of scalability and adaptability.

According to these conventional methods, after a large amount of data is collected through experiments in advance, internal states of the battery are extracted by using the collected data. Because the internal states of the battery are affected by several variables, in order to accurately estimate the internal state of the battery, a combination of various variables, such as a state of charge (SOC) of the battery, current, voltage, and temperature, needs to be made, and data needs to be collected for each of them. Thus, the higher the accuracy is required, the more data is required, resulting in an increase in time and monetary costs.

In addition, when the internal state of the battery is estimated for a value exceeding the range of variables measured in the experiment, for example, when the internal state of the battery at a high temperature or low temperature is estimated by using the correlation between data measured at room temperature and the internal state of the battery, it may be difficult to rely on an estimated value.

In order to estimate the state information of the battery pack, experimental data about the battery pack is required. However, due to high costs required to collect experimental data of the battery pack, in general, the state information about the battery pack is estimated by using data measured in a battery cell. However, this practice is based on the assumption that the relationship between variables measured in the battery cell is a scalable mechanism to a larger system such as the battery pack. Thus, unless additional verification is performed to prove the scalability of the mechanism in advance, it may be difficult to rely on the state information estimated for the battery pack in the above manner due to a problem in accuracy.

In addition, a battery internal state estimation method according to the related art has poor adaptability. Batteries have different characteristics over time. This is referred to as an aging effect. Due to the aging effect, the correlation between the measurable variables such a voltage, current, and temperature of the battery and the internal state changes over time. However, when a table that summarizes the correlation between data collected through experiments in advance and the internal state is completed, it is difficult to reflect the aging effect. In order to reflect the aging effect on the table, many experiments on the aging effect need to be performed in advance, or the aging effect needs to be accurately predicted and reflected in an experimental model in advance. However, the former has a problem of increasing the cost, and the latter has the risk that the reliability of the internal state estimate is poor when the aging effect cannot be accurately predicted in advance. Furthermore, not only the time but also the design change of the battery cell, such as an active material used in the battery cell or the shape of the battery cell, may cause changes in the characteristics of the battery cell. When these changes are not predicted and reflected in the experimental model in advance, if a design change occurs in the future, the existing experimental model cannot be used.

The internal state of the battery may also be estimated by using an electrochemical model (for example, Newman's model) considering electrochemical phenomena and thermal behaviors in the battery in addition to the experimental model. The use of the electrochemical model has an advantage that physical states, which are difficult to measure directly, can be used as a control parameter of the BMS. However, the method of using an electrochemical model is difficult to be utilized in the BMS because it has a disadvantage in that development time and cost are excessively required and resources required for calculation are too large.

In a multi-scale multi-dimensional (MSMD) model suggested to overcome disadvantages of the conventional experimental model and the electrochemical model, the analysis domain of the battery is hierarchically divided into a particle level where microscopic physics occur, a plate level, and a cell level where macrophysical phenomena occur. In the analysis domain of the particle level, the behavior of lithium ions inside solid active material particles is modeled, and this is referred to as a particle domain model (PDM). In the analysis domain of the plate level, the behavior of voltage and current inside the plate are modeled through conservation equations for electrons and ions in the plate and electrolyte, and this is referred to as an electrode domain model (EDM). In the analysis domain of the cell level that is the uppermost level, the behavior of temperature, current and voltage of the entire cell including a plate current collector is modeled, and this is referred to as a cell domain model (CDM).

In each analysis domain, modeling and calculation are performed independently. However, each analysis domain is not completely divided, and minimum information required for analysis is exchanged between adjacent areas. In an MSMD model, the analysis domain is hierarchically divided according to the size of physical phenomena so that an interaction of complicated multi-physical phenomena may be efficiently calculated. In addition, due to computational independence between analysis domains, model selection is freely performed. For example, when exchange of information between analysis domains is done properly, even when any model is used at the particle level, this does not affect the model selection at a higher level. In addition, the modular structure of the MSMD model has a high scalability that may be applied not only to a single cell but also to a battery pack.

Despite the improved computational efficiency, model selection flexibility, and scalability compared to conventional models, the MSMD model is complex and computationally intensive and thus it is difficult to use the MSMD model to estimate the internal state of the battery in use in a real electrical device. In order to solve these problems, inventors of the present disclosure have developed a GH-MSMD model using a G parameter and an H parameter so as to drastically increase calculation speed in the existing MSMD model.

The G parameter is a state amount indicating the sensitivity of a terminal voltage to a change in applied current of the battery being used, and has a unit of resistance. The H parameter is the effective potential determined by local equilibrium potential distribution and resistance distribution in the battery during use. The G parameter and the H parameter of the battery may be quantified by explicit correlations between battery material properties and design variables using a theoretical model. Thus, the internal state of the battery may be simply estimated from the G parameter and the H parameter of the battery. Hereinafter, the G parameter and the H parameter of the battery will be described.

In the battery, it may be assumed that a voltage V and a current i has the same relationship as $V=f(i; x, p)$. Here, x is a physical amount indicating the internal state of the battery, and p is a parameter.

A function f may be a nonlinear implicit function. If the function f can be divided into a rapidly changing amount g and a slowly changing amount h, the above relationship equation may be expressed as $V=g(i; x, p)+h(i; x, p)$.

Assuming that there is a function $G(i; x, p)=dg/di$ that changes slowly with respect to the current i, the above relationship equation may be expressed as $V=G(i; x, p)i+H(i; x, p)$.

In the above relationship equation, dG/di and dH/di have very small values. In other words, if the above-described assumptions are satisfied, G and H are functions that change slowly with respect to the current i. Thus, the function f indicating the nonlinear relationship between the voltage V and the current i may be expressed in a quasi-linear relationship.

Here, G is referred to as a G parameter, and H is referred to as an H parameter. When the current i is a charging/discharging current and Ueq is an equilibrium potential of a battery, a discharging overvoltage may be expressed as $Ueq-V=-Gi+(Ueq-H)$ by using the G parameter G and the H parameter H.

Here, $-G \cdot I$ is an overvoltage generated by the battery to flow current through a terminal, and includes a reaction dynamic polarization amount and an electron and ion resistance polarization amount. (Ueq–H) is the overvoltage caused by the local thermodynamic equilibrium of the battery deviating from the overall system equilibrium. That is, (Ueq–H) represents the inefficiency caused by the thermodynamic non-uniformity inside the battery, and when the internal system of the battery reaches the thermodynamic equilibrium state, the H parameter H is equal to the equilibrium potential Ueq.

In the battery state estimation method according to embodiments of the present disclosure, the G parameter G and the H parameter H are extracted directly from the voltage value and the current value measured in the battery by using a recursive least squares (RLS) method, for example, and the internal state of the battery may be estimated therethrough.

Figure 2:
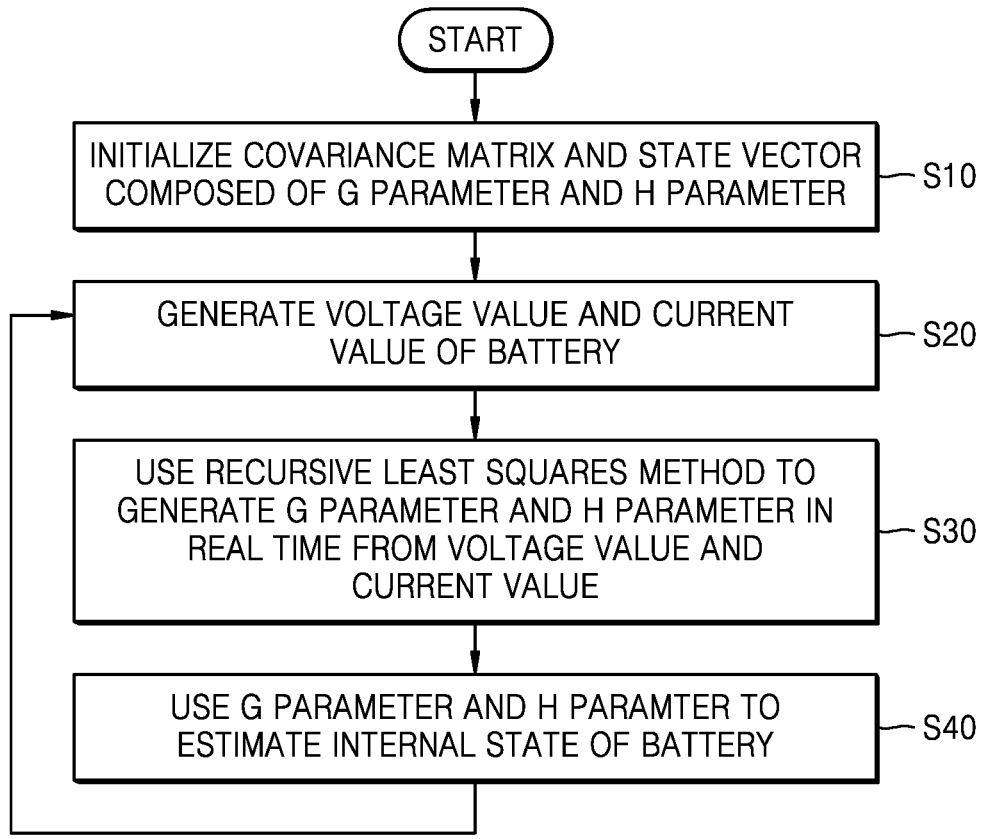
FIG. 2 is a flowchart illustrating a battery state estimation method according to an embodiment.

FIG. 2 is a flowchart illustrating a battery state estimation method according to an embodiment.

Referring to FIGS. 1 and 2, the microprocessor 140 may perform the battery state estimation method shown in FIG. 2 by using an RLS method.

In the battery state estimation method according to the present embodiment, a state vector $\hat{\Theta}(t)$ composed of a G parameter $\hat{G}(t)$ and an H parameter $\hat{H}(t)$ and a covariance matrix P(t) may be used in the RLS method.

The state vector $\hat{\Theta}(t)$ may be defined as below.

$$\hat{\Theta}(t) = \begin{bmatrix} \hat{G}(t) \\ \hat{H}(t) \end{bmatrix}$$

The covariance matrix P(t) may be defined as below.

$$P(t) = \begin{bmatrix} P_1(t) \\ P_2(t) \end{bmatrix}$$

As the voltage value V(t) and the current value I(t) of the battery 110 are measured every first time period $\Delta t$, the state vector $\hat{\Theta}(t)$ and the covariance matrix P(t) may be updated every first time period $\Delta t$ by using a recursive method. Thus, the G parameter $\hat{G}(t)$ and the H parameter $\hat{H}(t)$ may also be updated every first time period $\Delta t$.

In the battery state estimation method according to the present embodiment, the microprocessor 140 may initialize the state vector $\hat{\Theta}(t)$ and the covariance matrix P(t) as below (S10).

$$\hat{\Theta}(0) = \begin{bmatrix} \hat{G}(0) \\ \hat{H}(0) \end{bmatrix} = \begin{bmatrix} 1 \\ 1 \end{bmatrix}$$

$$P(0) = \begin{bmatrix} P_1(0) \\ P_2(0) \end{bmatrix} = \begin{bmatrix} 1 \\ 1 \end{bmatrix}$$

In the present example, although all of elements of the state vector $\hat{\Theta}(t)$ and elements of the covariance matrix P(t) have been initialized as 1, this is just an example, and these elements may be initialized as another value.

The microprocessor 140 may use the voltage measurement unit 120 and the current measurement unit 130 so as to measure the voltage and the current of the battery 110 periodically, for example, every first time period $\Delta t$, and to generate a voltage value and a current value of the battery 110 (S20). The currently measured voltage value and currently measured current value are referred to as a current voltage value V(t) and a present current value I(t), respectively, and the voltage value and the current value measured before the first time period $\Delta t$ are referred to as an immediately preceding voltage value V(t−1) and an immediately preceding current value I(t−1), respectively.

The microprocessor 140 may use the RLS method so as to generate the G parameter $\hat{G}(t)$ and the H parameter $\hat{H}(t)$ in real time from the voltage value and the current value (S30). In the battery state estimation method according to the present disclosure, the G parameter $\hat{G}(t)$ and the H parameter $\hat{H}(t)$ are updated according to the current voltage value V(t) and the present current value I(t) received every first time period $\Delta t$.

Because the battery state estimation method according to the present embodiment uses the recursive method, before the current voltage value V(t) and the present current value I(t) are generated, an immediately preceding value $\hat{\Theta}(t-1)$ of the state vector and an immediately preceding value P(t−1) of the covariance matrix are calculated on the basis of the immediately preceding voltage value V(t−1) and the immediately preceding current value I(t−1).

When the present voltage value V(t) and the present current value I(t) are generated, the microprocessor 140 may calculate a present voltage estimate $\hat{V}(t)$ of the battery 110 on the basis of the present current value I(t) and the immediately preceding value $\hat{\Theta}(t-1)$ of the state vector.

The immediately preceding value $\hat{\Theta}(t-1)$ of the state vector is composed of an immediately preceding value at $\hat{G}(t-1)$ of the G parameter and an immediately preceding value $\hat{H}(t-1)$ of the H parameter. The present voltage estimate $\hat{V}(t)$ of the battery 110 may be calculated a value obtained by adding the immediately preceding value $\hat{H}(t-1)$ of the H parameter to a product of the present current value I(t) and the immediately preceding value $\hat{G}(t-1)$ of the G parameter and may be expressed by the following equation.

$$\hat{V}(t) = I(t)\hat{G}(t-1) + \hat{H}(t-1)$$

The microprocessor 140 may update a gain matrix L(t) on the basis of the present current value I(t) and the immediately preceding value P(t−1) of the covariance matrix. According to the definition of the covariance matrix P(t), the immediately preceding value P(t−1) of the covariance matrix is composed of a first immediately preceding value $P_1(t-1)$ of the covariance matrix and a second immediately preceding value $P_2(t-1)$ of the covariance matrix. The gain matrix L(t) is used to update the state vector $\hat{\Theta}(t)$ and the covariance matrix P(t). The gain matrix L(t) may be calculated as below.

$$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda_1 \\ P_2(t-1)/\lambda_2 \end{bmatrix}$$

Here, $\lambda_1$ may be a first forgetting factor relating to a G parameter. $\lambda_2$ may be a second forgetting factor relating to an H parameter. The first forgetting factor $\lambda_1$ and the second forgetting factor $\lambda_2$ are values in which, when the G parameter $\hat{G}(t)$ and the H parameter $\hat{H}(t)$ are calculated, the effect of the past voltage value and the past current value on a present value $\hat{G}(t)$ of the G parameter and a present value $\hat{H}(t)$ of the H parameter is indicated. As getting close to 1, the first forgetting factor $\lambda_1$ and the second forgetting factor $\lambda_2$ affect the present value $\hat{G}(t)$ of the G parameter and the present value $\hat{H}(t)$ of the H parameter during a long time, and as getting close to zero, they affect the present value $\hat{G}(t)$ of the G parameter and the present value $\hat{H}(t)$ of the H parameter only during a short time.

According to an example, the first forgetting factor $\lambda_1$ and the second forgetting factor $\lambda_2$ may be greater than or equal to 0.9 and less than or equal to 1. According to another example, the first forgetting factor $\lambda_1$ may be set as a value that is greater than or equal to the second forgetting factor $\lambda_2$. For example, the first forgetting factor $\lambda_1$ may be set as 0.9999, and the second forgetting factor $\lambda_2$ may be set as 0.95. These setting values may vary according to characteristics of the battery 110.

The inventors of the present disclosure have found that the high reliability results were derived when the first forgetting factor $\lambda_1$ and the second forgetting factor $\lambda_2$ were 0.9999 and 0.95, respectively, in an experiment performed on a specific battery. However, the above values are examples, and other values may be set according to the characteristics of the battery 110. For example, the first forgetting factor $\lambda 1$ may be set as 1, and the second forgetting factor $\lambda_2$ may be set as 0.98.

In another example, all of the first forgetting factor $\lambda_1$ and the second forgetting factor $\lambda_2$ may also be set as 1. In this case, it may be regarded that the first forgetting factor $\lambda_1$ and the second forgetting factor $\lambda_2$ were not applied.

The microprocessor 140 may update the covariance matrix P(t) on the basis of the present current value I(t), the gain matrix L(t), and the immediately preceding value P(t−1) of the covariance matrix. The gain matrix L(t) calculated earlier is composed of a first value $L_1(t)$ of the gain matrix and a second value $L_2(t)$ of the gain matrix. The covariance matrix P(t) may be calculated as below.

$$P(t) = \begin{bmatrix} P_1(t) \\ P_2(t) \end{bmatrix} = \begin{bmatrix} \{1 - L_1(t)I(t)\}P_1(t-1)/\lambda_1 \\ \{1 - L_2(t)\}P_2(t-1)/\lambda_2 \end{bmatrix}$$

The microprocessor 140 may calculate a voltage error e(t) between the present voltage value V(t) and the present voltage estimate $\hat{V}(t)$ calculated earlier, as follows.

$$e(t) = V(t) - \hat{V}(t)$$

The microprocessor 140 may update the state vector $\hat{\Theta}(t)$ on the basis of the immediately preceding value $\hat{\Theta}(t-1)$ of the state vector, the present value L(t) of the gain matrix, and the voltage error e(t), thereby generating a present value $\hat{G}(t)$ of the G parameter and a present value $\hat{H}(t)$ of the H parameter.

The present value $\hat{\Theta}(t)$ of the state vector may be calculated as a value obtained by adding a product of the present value L(t) of the gain matrix and the voltage error e(t) to the immediately preceding value $\hat{\Theta}(t-1)$ of the state vector as follows.

$$\hat{\Theta}(t) = \begin{bmatrix} \hat{G}(t) \\ \hat{H}(t) \end{bmatrix} = \hat{\Theta}(t-1) + L(t) \times e(t)$$

The above equation in which the state vector $\hat{\Theta}(t)$ is recursively expressed, may be derived as below.

Firstly, a loss-function ε to which the first forgetting factor $\lambda_1$ and the second forgetting factor $\lambda_2$ are applied, is defined as below.

$$\epsilon(\hat{G}(t), \hat{H}(t), t) =$$
$$\frac{1}{2}\sum_{i=1}^{t} \lambda_1^{t-i}\{V(i) - I(i)\hat{G}(t) - H(i)\}^2 + \frac{1}{2}\sum_{i=1}^{t} \lambda_2^{t-i}\{V(i) - I(i)G(i) - \hat{H}(t)\}^2$$

Here, V(i) is an i-th voltage value, and I(i) is an i-th current value. Because t means the present, V(t) and I(t) are a present voltage value and a present current value, respectively. Thus, V(t−1) and I(t−1) are an immediately preceding voltage value and an immediately preceding current value, respectively.

G(i) and H(i) are actual values of an i-th G parameter and an i-th H parameter, respectively, and $\hat{G}(t)$ and $\hat{H}(t)$ are a present value estimate of the G parameter and a present value estimate of the H parameter, respectively.

Because the loss-function ε needs to be minimum for $\hat{G}(t)$ and $\hat{H}(t)$, the results in which the loss-function ε is differentiated for $\hat{G}(t)$ and $\hat{H}(t)$, respectively, need to be zero.

Firstly, $\hat{G}(t)$ in which the results in which the loss-function ε is differentiated for $\hat{G}(t)$, are zero, is obtained as below.

$$\frac{\partial \epsilon}{\partial \hat{G}(t)} = 0$$

$$\sum_{i=1}^{t} \lambda_1^{t-i}(-I(i))\{V(i) - I(i)\hat{G}(t) - H(i)\} = 0$$

Summarizing the above equation, $\hat{G}(t)$ is as follows.

$$\hat{G}(t) = \frac{\sum_{i=1}^{t} \lambda_1^{t-i}\{V(i) - H(i)\}}{\sum_{i=1}^{t} \lambda_1^{t-i} I(i)^2}$$

$\hat{H}(t)$ in which the results in which the loss-function ε is differentiated for $\hat{H}(t)$, are zero, is obtained as below.

$$\frac{\partial \epsilon}{\partial \hat{H}(t)} = 0$$

$$\sum_{i=1}^{t} \lambda_2^{t-i}(-1)\{V(i) - I(i)G(i) - \hat{H}(t)\} = 0$$

Summarizing the above equation, $\hat{H}(t)$ is as follows.

$$\hat{H}(t) = \frac{\sum_{i=1}^{t} \lambda_2^{t-i}\{V(i) - I(i)G(i)\}}{\sum_{i=1}^{t} \lambda_2^{t-i}}$$

For real time estimation, $\hat{G}(t)$ and $\hat{H}(t)$ obtained earlier are summarized in a recursive form by using the state vector $\hat{\Theta}(t)$ as follows.

$$\hat{\Theta}(t) = \begin{bmatrix} \hat{G}(t) \\ \hat{H}(t) \end{bmatrix} = \hat{\Theta}(t-1) + L(t) \times (V(t) - I(t)\hat{G}(t-1) - \hat{H}(t-1))$$

Because the voltage error e(t) and the present voltage estimate $\hat{V}(t)$ are calculated as e(t)=V(t)−$\hat{V}(t)$ and $\hat{V}(t)$=I(t)$\hat{G}(t-1)+\hat{H}(t)$−1), respectively, the state vector $\hat{\Theta}(t)$ may be expressed as follows, as described above.

$$\hat{\Theta}(t) = \begin{bmatrix} \hat{G}(t) \\ \hat{H}(t) \end{bmatrix} = \hat{\Theta}(t-1) + L(t) \times e(t)$$

Here, the gain matrix L(t) and the covariance matrix P(t) are calculated as follows, as described above.

$$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda_1 \\ P_2(t-1)/\lambda_2 \end{bmatrix}$$

$$P(t) = \begin{bmatrix} P_1(t) \\ P_2(t) \end{bmatrix} = \begin{bmatrix} \{1 - L_1(t)I(t)\}P_1(t-1)/\lambda_1 \\ \{1 - L_2(t)\}P_2(t-1)/\lambda_2 \end{bmatrix}$$

The storage unit 150 may store commands for performing the battery state estimation method shown in FIG. 2 and several variables. The variables that need to be stored in the storage unit 150 may be the state vector $\hat{\Theta}(t)$ including $\hat{G}(t)$ and $\hat{H}(t)$ and the covariance matrix P(t). When the microprocessor 140 receives the present voltage value V(t) and the present current value I(t), the state vector $\hat{\Theta}(t)$ and the covariance matrix P(t) may be updated by using a recursive method using the immediately preceding value $\hat{\Theta}(t-1)$ of the state vector and the immediately preceding value P(t−1) of the covariance matrix.

The first forgetting factor $\lambda_1$ and the second forgetting factor $\lambda_2$ may be further stored in the storage unit 150. In addition, the gain matrix L(t) may be stored in the storage unit 150 according to a calculation order. All of the past voltage values and current values do not need to be stored in the storage unit 150.

Because the battery state estimation method shown in FIG. 2 uses the recursive method, calculations are very simple, and calculations are possible only using the storage unit 50 having a small size of several kB. Furthermore, because the state vector $\hat{\Theta}(t)$ and the covariance matrix P(t) are newly updated whenever the voltage value and the current value are received, voltage and current fluctuations of the battery 110 may be substantially reflected on the G parameter $\hat{G}(t)$ and the H parameter $\hat{H}(t)$ in real time.

The microprocessor 140 may use the G parameter $\hat{G}(t)$ and the H parameter $\hat{H}(t)$ generated in Operation (S30) so as to estimate the state of the battery 110 in real time (S40).

The microprocessor 140 may repeatedly perform Operations S20 to S40 every first time period Δt in which the voltage value V(t) and the current value I(t) of the battery 110 are measured.

Figure 3:
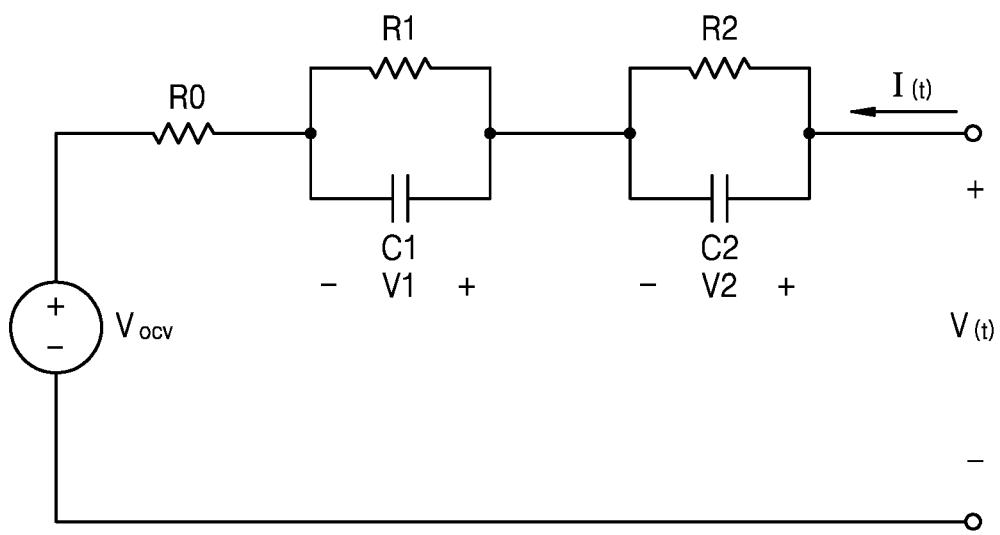
FIG. 3 illustrates an equivalent circuit of a battery.

FIG. 3 illustrates an equivalent circuit of the battery 110.

The battery 110 may be modeled as an equivalent circuit in which a voltage source Vocv, a series resistor R0, a first resistor-capacitor (RC) network R1 and C1 and a second RC network R2 and C2 are connected in series. The equivalent circuit of FIG. 3 is most commonly used in a battery field.

The state of the battery 110 estimated by the microprocessor 140 in Operation S40 may be at least one from among a voltage of the voltage source Vocv of the battery 110, the series resistance R0, and the sum (R0+R1+R2) of resistance components of the equivalent circuit of the battery 110 when the battery 110 is modeled as the equivalent circuit of FIG.

3. The state of the battery 110 estimated in Operation S40 may be a value obtained by subtracting the sum of the first voltage V1 falling in the first RC network R1 and C1 and the second voltage V2 falling in the second RC network R2 and C2 from the voltage of the voltage source Vocv.

When the battery 110 is modeled as an equivalent circuit in which the voltage source Vocv, the series resistor R0, n RC networks (where, n is a natural number that is equal to or greater than 1) are connected in series, the sum of resistance components of the equivalent circuit of the battery 110 that may be estimated in Operation S40 is the sum of the series resistance R0 and n resistances included in n RC networks.

Figure 4:
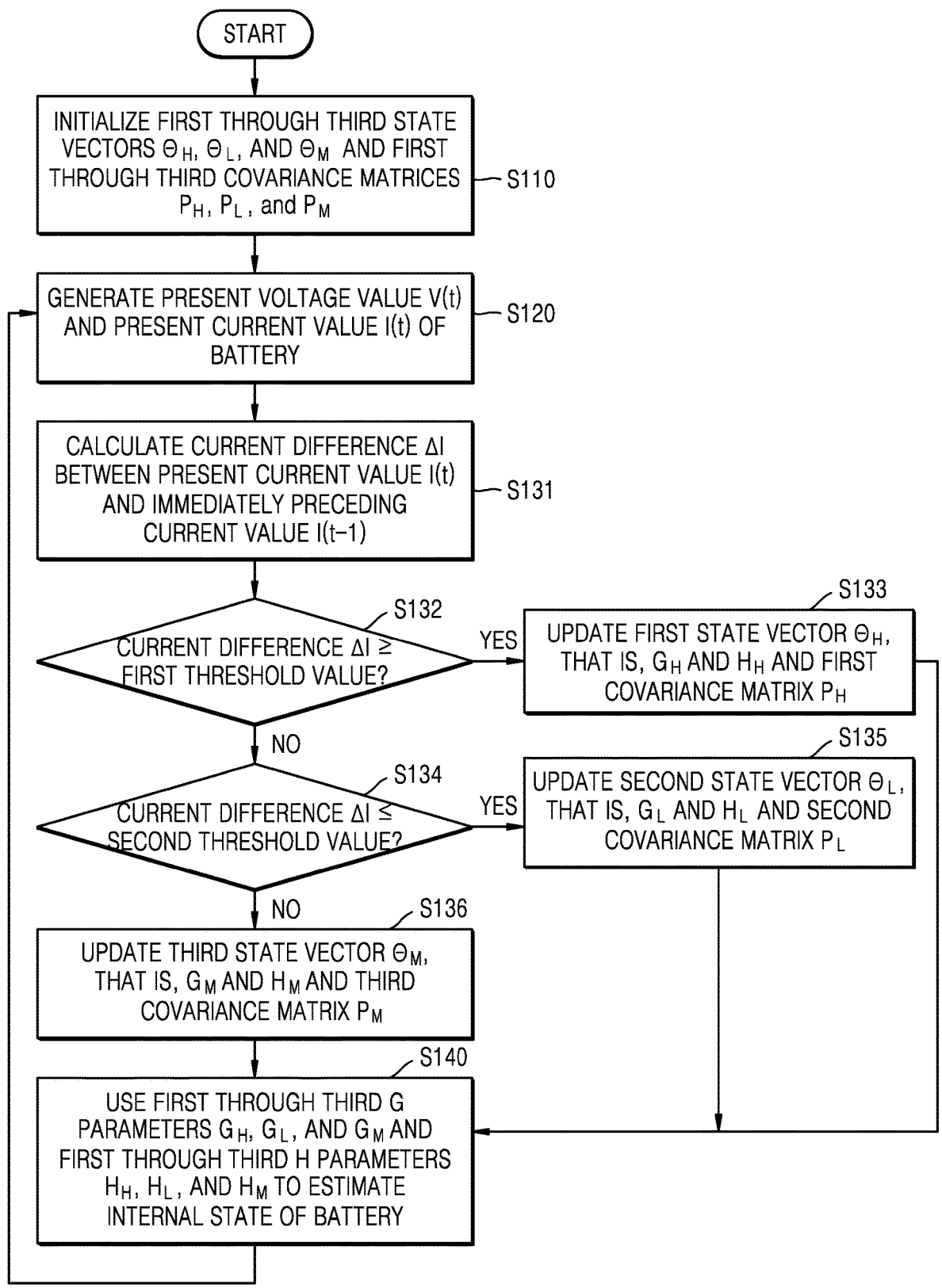
FIG. 4 is a flowchart illustrating a battery state estimation method according to another embodiment.

According to the battery state estimation method of FIG. 2, one G parameter G and one H parameter H are updated on the basis of the past voltage values V and the past current values I, whereas, according to the battery state estimation method of FIG. 4, there is a difference in that a plurality of G parameters G and a plurality of H parameters H divided based on a current change amount ΔI are updated.

In the example of FIG. 4, G parameters G and H parameters H are divided into three based on the current change amount ΔI, but this is just an example, and the G parameters G and the H parameters H may also be divided into less or more numbers.

Detailed method and equations for updating the G parameters G and the H parameters H in FIG. 4 have been described above with reference to FIG. 2 and thus, will not be repeatedly described. In addition, in FIG. 2, in order to describe the equations and a derivation method thereof, the G parameter is indicated by $\hat{G}(t)$, and the H parameter is indicated by $\hat{H}(t)$. However, in the following description relating to the battery state estimation method of FIG. 4, the G parameter is simply indicated by "G", and the H parameter is simply indicated by "H". In addition, the state vector is indicated by "Θ", and the covariance matrix is indicated by "P". Although briefly described as above, those skilled in the art will easily understand a way to update the state vector Θ composed of the G parameter G and the H parameter H and the covariance matrix P with reference to the description of FIG. 2.

According to the battery state estimation method of FIG. 4, first through third state vectors $\Theta_H$, $\Theta_L$, and $\Theta_M$ and first through third covariance matrices $P_H$, $P_L$, and $P_M$ are prepared. The first through third state vectors $\Theta_H$, $\Theta_L$, and $\Theta_M$ and the first through third covariance matrices $P_H$, $P_L$, and $P_M$ may be stored in the storage unit 150. The first through third state vectors $\Theta_H$, $\Theta_L$, and $\Theta_M$ are composed of first through third G parameters $G_H$, $G_L$, and $G_M$ and first through third H parameters $H_H$, $H_L$, and $H_M$.

The microprocessor 140 may initialize the first through third state vectors $\Theta_H$, $\Theta_L$, and $\Theta_M$ and the first through third covariance matrices $P_H$, $P_L$, and $P_M$ (S110). Like in Operation S10 of FIG. 2, all elements of the first through third state vectors $\Theta_H$, $\Theta_L$, and $\Theta_M$ and the first through third covariance matrices $P_H$, $P_L$, and $P_M$ may be initialized as 1. However, this is just an example, and these elements may be initialized as another value.

The microprocessor 140 may use the voltage measurement unit 120 and the current measurement unit 130 of FIG. 1 so as to measure the voltage and current of the battery 110 periodically, for example, every first time period Δt and to generate a voltage value and a current value (S120).

The microprocessor 140 may calculate a current difference ΔI between a present current value I(t) and an immediately preceding current value I(t−1) (S131). The current difference ΔI may be calculated as in |I(t)−I(t−1)|. The storage unit 150 may further store the immediately preceding current value I(t−1). When the first time period Δt elapses, the present current value I(t) may be the immediately preceding current value I(t−1).

The current difference ΔI calculated in Operation S131 is compared with a first threshold value (S132). The first threshold value may be set according to the capacity of the battery 110. For example, the first threshold value may be set as a value that corresponds to a charging/discharging current that is greater or equal to 0.4 C and less than or equal to 5 C according to the capacity of the battery 110. For example, the first threshold value may be set as a value in which the battery 110 corresponds to a charging/discharging current of 0.5 C. When the capacity of the battery 110 is 50 Ah, the first threshold value may be set as 25 A that corresponds to a charging/discharging current of 0.5 C.

When the current difference ΔI is greater than or equal to the first threshold value in Operation S132, a first state vector $\Theta_H$ composed of the first G parameter $G_H$ and the first H parameter $H_H$, and a first covariance matrix $P_H$ are updated (S133). In detail, the present voltage estimate $\hat{V}$ of the battery 110 may be calculated based on the present current value I(t) and a recent value $\Theta_H'$ of the first state vector. The recent value $\Theta_H'$ of the first state vector means a value stored as the first state vector $\Theta_H$ in the storage unit 150.

A gain matrix L may be calculated based on the present current value I(t) and a recent value $P_H'$ of the first covariance matrix. The recent value $P_H'$ of the first covariance matrix means a value stored as the first covariance matrix $P_H$ in the storage unit 150. In addition, the first covariance matrix $P_H$ may be calculated based on the present current value I(t), the gain matrix L, and the recent value $P_H'$ of the first covariance matrix. Even when the gain matrix L and the first covariance matrix $P_H$ are calculated, the first forgetting factor $\lambda_1$ relating to the first G parameter $G_H$ and the second forgetting factor $\lambda_2$ relating to the first H parameter $H_H$ may be applied.

The voltage error e is calculated by subtracting the present voltage estimate $\hat{V}$ from the present voltage value V(t). The first state vector $\Theta_H$ may be calculated based on the recent value $\Theta_H'$ of the first state vector, the gain matrix L calculated earlier and the voltage error e. The first state vector $\Theta_H$ may be calculated so that the first G parameter $G_H$ and the first H parameter $H_H$ may be calculated together and the present value of the first G parameter $G_H$ and the present value of the first H parameter $H_H$ may be generated.

The equations for calculating the present voltage estimate $\hat{V}$, the gain matrix L, the first covariance matrix $P_H$, and the first state vector $\Theta_H$ have been described above with reference to FIG. 2 and thus, will not be repeatedly described.

When the current difference ΔI is less than the first threshold value in Operation S131, the current difference ΔI calculated in Operation S131 is compared with a second threshold value (S134). The second threshold value that is less than the first threshold value may be set according to the capacity of the battery 110. For example, the second threshold value may be set as a value that corresponds to a charging/discharging current that is greater than or equal to 0.0001 C and less than or equal to 0.01 C according to the capacity of the battery 110. For example, the second threshold value may be set as a value in which the battery 110 corresponds to a charging/discharging current of 0.001 C. For example, when the capacity of the battery 110 is 50 Ah, the second threshold value may be set to 0.05 A that corresponds to a charging/discharging current of 0.001 C.

When the current difference ΔI is less than or equal to the second threshold value in Operation S134, the second state vector $Θ_L$ composed of the second G parameter $G_L$ and the second H parameter $H_L$ and the second covariance matrix $P_L$ are updated (S135). In detail, the present voltage estimate $\hat{V}$ of the battery 110 may be calculated based on the present current value I(t) and the recent value $Θ_L'$ of the second state vector. The recent value $Θ_L'$ of the second state vector means a value stored as the second state vector $Θ_L$ in the storage unit 150.

The gain matrix L may be calculated based on the present current value I(t) and the second covariance matrix $P_L'$. The recent value $P_L'$ of the second covariance matrix means a value stored as the second covariance matrix $P_L$ in the storage unit 150. In addition, the second covariance matrix $P_L$ may be calculated based on the present current value I(t), the gain matrix L, and the recent value $P_L'$ of the second covariance matrix. Even when the gain matrix L and the second covariance matrix $P_L$ are calculated, the first forgetting factor $λ_1$ relating to the second G parameter $G_L$ and the second forgetting factor $λ_2$ relating to the second H parameter $H_L$ may be applied.

The first forgetting factor $λ_1$ relating to the second G parameter $G_L$ may be the same as or different from the first forgetting factor $λ_1$ relating to the first G parameter $G_H$, which is described in Operation S133. In addition, the second forgetting factor $λ_2$ relating to the second H parameter $H_L$ may be the same as or different from the second forgetting factor $λ_2$ relating to the first H parameter $H_H$, which is described in Operation S133.

The voltage error e may be calculated by subtracting the present voltage estimate $\hat{V}$ from the present voltage value V(t). The second state vector $Θ_L$ may be calculated based on the recent value $Θ_L'$ of the second state vector, the gain matrix L calculated earlier and the voltage error e. The second state vector $Θ_L$ may be calculated so that the present value of the second G parameter $G_L$ and the present value of the second H parameter $H_L$ may be generated.

The equations for calculating the present voltage estimate $\hat{V}$, the gain matrix L, the second covariance matrix $P_L$, and the second state vector $Θ_L$ have been described above with reference to FIG. 2 and thus will not be repeatedly described.

When the current difference ΔI exceeds the second threshold value in Operation S134, i.e., when the current difference ΔI is less than the first threshold value and exceeds the second threshold value, the third state vector $Θ_M$ composed of the third G parameter $G_M$ and the third H parameter $H_M$ and the third covariance matrix $P_M$ are updated (S136). In detail, the present voltage estimate $\hat{V}$ of the battery 110 may be calculated based on the present current value I(t) and the recent value $Θ_M'$ of the third state vector. The recent value $Θ_M'$ of the third state vector means a value stored as the third state vector $Θ_M$ in the storage unit 150.

The gain matrix L may be calculated based on the present current value I(t) and the recent value $P_M'$ of the third covariance matrix. The recent value $P_M'$ of the third covariance matrix means a value stored as the third covariance matrix $P_M$ in the storage unit 150. In addition, the third covariance matrix $P_M$ may be calculated based on the present current value I(t), the gain matrix L, and the recent value $P_M'$ of the third covariance matrix. Even when the gain matrix L and the third covariance matrix $P_M$ are calculated, the first forgetting factor $λ_1$ relating to the third G parameter $G_M$ and the second forgetting factor $λ_2$ relating to the third H parameter $H_M$ may be applied.

The voltage error e is calculated by subtracting the present voltage estimate $\hat{V}$ from the current voltage value V(t). The third state vector $Θ_M$ may be calculated based on the recent value $Θ_M'$ of the third state vector, the gain matrix L calculated earlier, and the voltage error e. The third state vector $Θ_M$ may be calculated so that the present value of the third G parameter $G_M$ and the present value of the third H parameter $H_M$ may be generated.

The equations for calculating the present voltage estimate $\hat{V}$, the gain matrix L, the third covariance matrix $P_M$, and the third state vector $Θ_M$ have been described above with reference to FIG. 2 and thus will not be repeatedly described.

When Operations S133, S135 and S136 are terminated, the microprocessor 140 may estimate the internal state of the battery 110 based on the first through third G parameters $G_H$, $G_L$, and $G_M$ and the first through third H parameters $H_H$, $H_L$, and $H_M$ (S140). When the battery 110 is modeled as the equivalent circuit of FIG. 3, the series resistance R0 of the equivalent circuit is estimated in real time as a value of the first G parameter $G_H$. In addition, the sum (that is, R0+R1+R2) of resistance components of the equivalent circuit of FIG. 3 is estimated in real time as a value of the second G parameter $G_L$. When the battery 110 is modeled as an equivalent circuit including an n-th RC network, the sum of resistance components of the equivalent circuit may also be estimated in real time as a value of the second G parameter $G_L$.

The voltage of the voltage source Vocv of the equivalent circuit of FIG. 3 may be estimated in real time as a value of the second H parameter $H_L$. In addition, in the equivalent circuit of FIG. 3, a value obtained by subtracting the sum of the first voltage V1 falling in the first RC network R1 and C1 and the second voltage V2 falling in the second RC network R2 and C2 from the voltage of the voltage source Vocv, may be estimated in real time as a value of the first H parameter $H_H$. In the equivalent circuit of FIG. 3, the sum (V1+V2) of the first voltage V1 falling in the first RC network R1 and C1 and the second voltage V2 falling in the second RC network R2 and C2 may be estimated in real time as a value obtained by subtracting the second H parameter $H_H$ from the first H parameter $H_H$.

Referring to FIG. 3, when the current difference ΔI is greater than or equal to the first threshold value in Operation S132 of FIG. 4, the current I(t) changes quickly. Thus, the first voltage V1 falling in the first RC network R1 and C1 and the second voltage V2 falling in the second RC network R2 and C2 non-linearly change with respect to the current I(t). Thus, the voltage V(t) and the current I(t) of the battery 110 have the following relationship.

$$V(t)=Vocv+I(t)R0+V1+V2$$

Thus, when the current difference ΔI is greater than or equal to the first threshold value, in Operation S133, the first G parameter $G_H$ is derived as R0, and the first H parameter $H_H$ is derived as Vocv+V1+V2.

When the current difference ΔI is less than or equal to the second threshold value in Operation S134 of FIG. 4, the current I(t) changes slowly. Thus, the first voltage V1 falling in the first RC network R1 and C1 may be expressed as a product of the current I(t) and the resistance R1, and the second voltage V2 falling in the second RC network R2 and C2 may be expressed as a product of the current I(t) and the resistance R2. Thus, the voltage V(t) and the current I(t) of the battery 110 have the following relationship.

$$V(t)=Vocv+I(t)R0+I(t)R1+I(t)R2$$

Thus, when the current difference ΔI is less than or equal to the second threshold value, the second G parameter $G_L$ may be derived as R0+R1+R2, i.e., ΣRi, and the second H parameter $H_L$ may be derived as Vocv.

Figure 5:
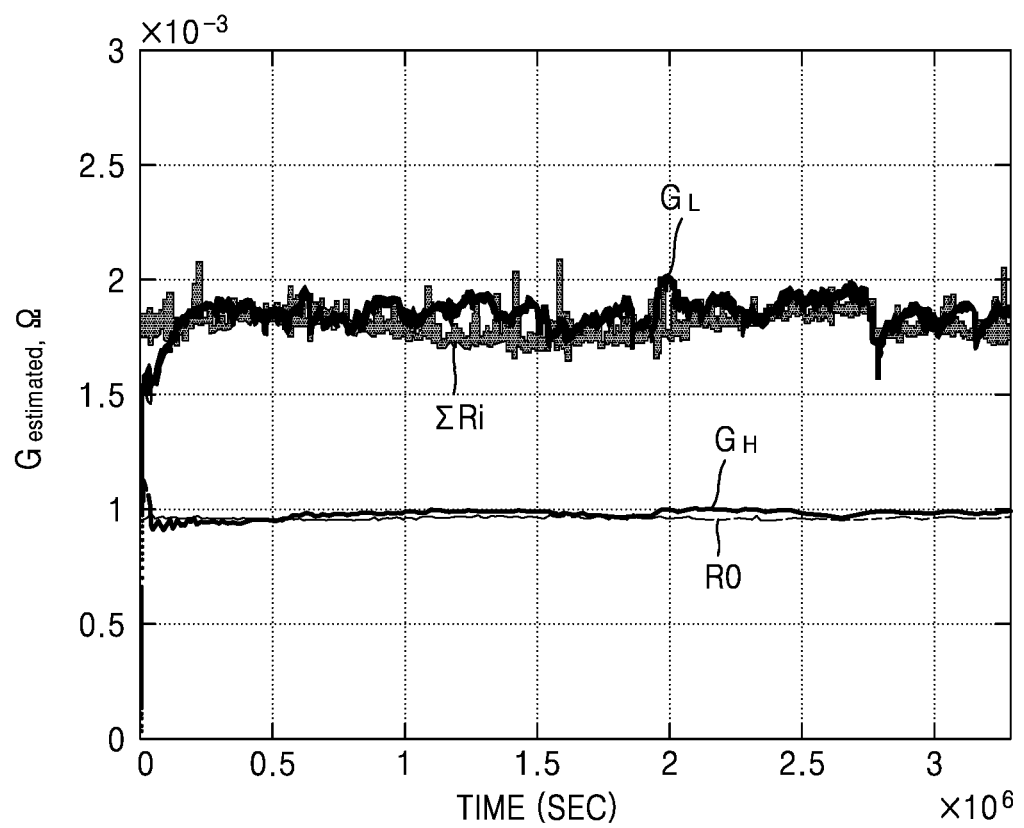
FIG. 5 is a graph comparing the sum of experimentally measured series resistance and resistance components with first and second G parameters $G_H$ and $G_L$ estimated in real time by using a battery state estimation method according to the present disclosure.

FIG. 5 is a graph comparing the sum of experimentally measured series resistance and resistance components with first and second G parameters $G_H$ and $G_L$ estimated in real time by using a battery state estimation method according to the present disclosure In the graph of FIG. 5, a battery having a capacity of 50 Ah is driven based on the current/voltage usage pattern for about 12 days, and the sum ΣRi of the series resistance R0 and resistance components measured experimentally for this battery is indicated. In this case, the first G parameter $G_H$ and the second G parameter $G_L$ estimated in real time based on the voltage value and the current value periodically measured for the battery in operation are illustrated in the graph of FIG. 5.

As shown in FIG. 5, it can be seen that the series resistance R0 of the battery measured experimentally is substantially the same as the second G parameter $G_L$ estimated in real time based on the voltage value and the current value periodically measured for the battery. In actuality, an error between the series resistance R0 of the battery measured experimentally and the second G parameter $G_L$ estimated in real time was less than 1%.

As shown in FIG. 5, the sum ΣRi of the resistance components of the battery measured experimentally is substantially the same as the first G parameter $G_H$ estimated in real time based on the voltage value and the current value measured periodically for the battery. In actuality, an error between the sum ΣRi of the resistance components of the battery measured experimentally and the first G parameter $G_H$ estimated in real time was less than 1%.

Figure 6:
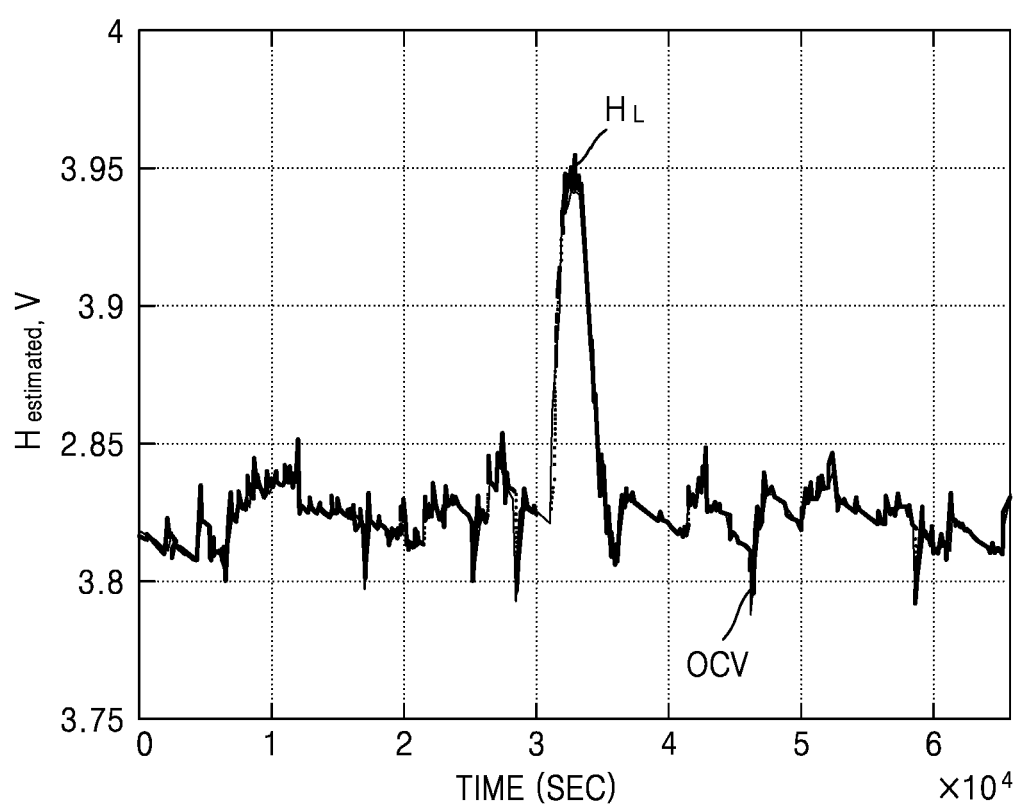
FIG. 6 is a graph comparing an experimentally obtained open circuit voltage of a battery with a second H parameter $H_L$ estimated in real time by using a battery state estimation method according to the present disclosure.

FIG. 6 is a graph comparing an experimentally obtained open circuit voltage of a battery with a second H parameter $H_L$ estimated in real time by using a battery state estimation method according to the present disclosure.

In the graph of FIG. 6, a battery having a capacity of 50 Ah is driven based on the current/voltage usage pattern for about 12 days, as in the graph of FIG. 5, and an OCV measured experimentally for this battery is indicated. In this case, the second H parameter $H_L$ estimated in real time based on the voltage value and the current value periodically measured for the battery in operation are illustrated in the graph of FIG. 6.

As shown in FIG. 6, it can be seen that the OCV of the battery measured experimentally is substantially the same as the second H parameter $H_L$ estimated in real time based on the voltage value and the current value periodically measured for the battery. In actuality, an error between the OCV of the battery measured experimentally and the second H parameter $H_L$ estimated in real time was less than 0.01%.

The spirit of the present disclosure is not limited to the above-described embodiments, and all ranges equivalent to the claims or equivalently changed therefrom as well as the claims described below belong to the scope of the spirit of the present disclosure.

The invention claimed is:

1. A battery state estimation method comprising:
periodically measuring voltage and current of a battery in use to generate a voltage value and a current value;
using an adaptive filter to generate a G parameter value for a G parameter and an H parameter value for an H parameter in real time from the voltage value and the current value, said G and H parameters indicating a present state of the battery; and
using the G parameter value and the H parameter value to estimate the present state of the battery in real time, wherein
the G parameter is a parameter that represents sensitivity of the voltage to changes in the current of the battery, and
the H parameter is a parameter that represents an effective potential determined by local equilibrium potential distribution and resistance distribution inside the battery.

2. The battery state estimation method of claim 1, wherein the adaptive filter is a filter using a recursive least squares method.

3. The battery state estimation method of claim 2, further comprising initializing a state vector composed of the G parameter and the H parameter, and a covariance matrix,
wherein the generating of the G parameter value and the H parameter value in real time comprises:
calculating a present voltage estimate of the battery based on a present current value and an immediately preceding value of the state vector and updating a gain matrix and the covariance matrix on a basis of the present current value and an immediately preceding value of the covariance matrix;
calculating a voltage error between a present voltage value and the present voltage estimate; and
updating the state vector based on the immediately preceding value of the state vector, a present value of the gain matrix, and the voltage error so as to generate a present value of the G parameter and a present value of the H parameter.

4. The battery state estimation method of claim 3, wherein the present voltage estimate of the battery is calculated as a value obtained by adding an immediately preceding value of the H parameter to a product of the present current value and an immediately preceding value of the G parameter.

5. The battery state estimation method of claim 3, wherein a present value of the state vector is calculated as a value obtained by adding a product of the present value of the gain matrix and the voltage error to the immediately preceding value of the state vector.

6. The battery state estimation method of claim 3, wherein, in a case where the gain matrix and the covariance matrix are updated, a first forgetting factor relating to the G parameter and a second forgetting factor relating to the H parameter are applied in updating the gain matrix and the covariance matrix.

7. The battery state estimation method of claim 6, wherein the gain matrix is calculated by the following equation, and $$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda_1 \\ P_2(t-1)/\lambda_2 \end{bmatrix}$$

the covariance matrix is calculated by the following equation, and $$P(t) = \begin{bmatrix} P_1(t) \\ P_2(t) \end{bmatrix} = \begin{bmatrix} \{1 - L_1(t)I(t)\}P_1(t-1)/\lambda_1 \\ \{1 - L_2(t)\}P_2(t-1)/\lambda_2 \end{bmatrix},$$

where L(t) is the present value of the gain matrix, L(t−1) is an immediately preceding value of the gain matrix, P(t) is a present value of the covariance matrix, P(t−1) is the immediately preceding value of the covariance matrix, I(t) is the present current value, $\lambda_1$ is the first forgetting factor, and $\lambda_2$ is the second forgetting factor.

8. The battery state estimation method of claim 3, wherein the G parameter, the H parameter, and the covariance matrix comprise first through third G parameters, first through third H parameters, and first through third covariance matrices, respectively, and the battery state estimation method further comprises initializing a first state vector composed of the first G parameter and the first H parameter, a second state vector composed of the second G parameter and the second H parameter, a third state vector composed of the third G parameter and the third H parameter, and the first through third covariance matrices.

9. The battery state estimation method of claim 8, further comprising, in a case where a current difference between the present current value and an immediately preceding current value is greater than or equal to a first threshold value, calculating the present voltage estimate of the battery based on the present current value and a recent value of the first state vector and updating the gain matrix and the first covariance matrix based on the present current value and an immediately preceding value of the first covariance matrix; and updating the first state vector based on the recent value of the first state vector, the present value of the gain matrix, and the voltage error so as to generate a present value of the first G parameter and a present value of the first H parameter.

10. The battery state estimation method of claim 9, further comprising, in a case where the battery is modeled as an equivalent circuit in which a voltage source Vocv, a series resistor R0 and two parallel resistor-capacitor networks are connected in series, estimating a value of the series resistor R0 of the battery based on the present value of the first G parameter.

11. The battery state estimation method of claim 8, further comprising, in a case where a current difference between the present current value and an immediately preceding current value is less than or equal to a second threshold value, calculating the present voltage estimate of the battery based on the present current value and a recent value of the second state vector and updating the gain matrix and the second covariance matrix based on the present current value and an immediately preceding value of the second covariance matrix; and updating the second state vector based on the recent value of the second state vector, the present value of the gain matrix, and the voltage error so as to generate a present value of the second G parameter and a present value of the second H parameter.

12. The battery state estimation method of claim 11, further comprising, in a case where the battery is modeled as an equivalent circuit in which a voltage source Vocv, a series resistor R0 and two parallel resistor-capacitor networks are connected in series, estimating a sum of resistance components of the equivalent circuit of the battery based on the present value of the second G parameter.

13. The battery state estimation method of claim 12, further comprising estimating the voltage source Vocv of the battery based on the present value of the second H parameter.

14. The battery state estimation method of claim 8, further comprising, in a case where a current difference between the present current value and an immediately preceding current value is less than a first threshold value and exceeds a second threshold value less than the first threshold value, calculating the present voltage estimate of the battery based on the present current value and a recent value of the third state vector and updating the gain matrix and the third covariance matrix based on the present current value and an immediately preceding value of the third covariance matrix; and updating the third state vector based on the recent value of the third state vector, the present value of the gain matrix and the voltage error so as to generate a present value of the third G parameter and a present value of the third H parameter.

* * * * *